United States Patent
Park et al.

(10) Patent No.: US 9,507,191 B2
(45) Date of Patent: Nov. 29, 2016

(54) WINDOW PANEL AND DISPLAY DEVICE INCLUDING THE SAME

(71) Applicant: SAMSUNG DISPLAY CO., LTD., Yongin, Gyeonggi-Do (KR)

(72) Inventors: Sang-Il Park, Yongin (KR); In Sun Hwang, Yongin (KR); Jeoung Sub Lee, Yongin (KR); Min Hoon Choi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 84 days.

(21) Appl. No.: 14/272,639

(22) Filed: May 8, 2014

(65) Prior Publication Data

US 2015/0195936 A1    Jul. 9, 2015

(30) Foreign Application Priority Data

Jan. 7, 2014  (KR) ........................ 10-2014-0001930

(51) Int. Cl.
| | |
|---|---|
| *H05K 5/03* | (2006.01) |
| *H05K 5/00* | (2006.01) |
| *G02F 1/1333* | (2006.01) |
| *G06F 1/16* | (2006.01) |
| *H01L 51/00* | (2006.01) |
| *H01L 27/32* | (2006.01) |
| *H04M 1/02* | (2006.01) |

(52) U.S. Cl.
CPC .......... *G02F 1/1333* (2013.01); *G06F 1/1652* (2013.01); *H01L 27/3211* (2013.01); *H01L 27/3293* (2013.01); *H01L 51/0097* (2013.01); *G02F 1/133305* (2013.01); *G02F 2201/56* (2013.01); *H04M 1/0268* (2013.01); *Y02E 10/549* (2013.01); *Y10T 428/24479* (2015.01); *Y10T 428/24521* (2015.01); *Y10T 428/24612* (2015.01)

(58) Field of Classification Search
CPC ....... G02F 1/113; G02F 1/1335; H05K 5/00; H05K 5/03
USPC ........... 359/628; 349/158; 361/618; 428/141
See application file for complete search history.

(56) References Cited

U.S. PATENT DOCUMENTS

| | | |
|---|---|---|
| 7,787,097 B2 | 8/2010 | Satoh |
| 7,868,545 B2 | 1/2011 | Hioki et al. |
| 8,098,486 B2 | 1/2012 | Hsiao et al. |
| 2013/0034685 A1 | 2/2013 | An et al. |
| 2013/0169515 A1 | 7/2013 | Prushinskiy et al. |

FOREIGN PATENT DOCUMENTS

| | | |
|---|---|---|
| KR | 10-2011-0057998 A | 6/2011 |
| KR | 10-2012-0116813 A | 10/2012 |

*Primary Examiner* — Bumsuk Won
*Assistant Examiner* — Grant Gagnon
(74) *Attorney, Agent, or Firm* — Lee & Morse P.C.

(57) ABSTRACT

A window panel includes a plurality of unit patterns arranged along a first direction, each of the plurality of unit patterns having a base surface portion, a plurality of inclined portions, the plurality of inclined portions being inclined upwardly from the base surface portion, and a top portion disposed at a top of the inclined portions, wherein a lower edge of a first inclined portion of each unit pattern of the plurality of unit patterns adjoins a lower edge of a second inclined portion of a neighboring unit pattern.

23 Claims, 15 Drawing Sheets

WINDOW PANEL AND DISPLAY DEVICE INCLUDING THE SAME

CROSS-REFERENCE TO RELATED APPLICATION

Korean Patent Application No. 10-2014-0001930, filed on Jan. 7, 2014, in the Korean Intellectual Property Office, and entitled: "Window Panel And Display Device Including The Same," is incorporated by reference herein in its entirety.

BACKGROUND

1. Field

Embodiments relate to a window panel and a display device including the same, and more particularly, to a window panel capable of being bent or folded and a display device including the same.

2. Description of the Related Art

The global market of display devices has rapidly evolved into focusing more on flat panel displays (FPDs) which are easy to fabricate as large-scale, thin, and light display devices. Examples of FPDs include liquid crystal displays (LCDs), plasma display panels (PDPs), organic light-emitting diode (OLED) displays, etc. Typical LCDs, PDPs and OLEDs, however, have a limited range of application and use. Therefore, recently, flexible displays, which are fabricated by using a flexible substrate formed of, e.g., a plastic material or foil, instead of using a glass substrate, and can thus be bent, have been developed as next-generation displays.

SUMMARY

According to embodiments, there is provided a window panel, including a plurality of unit patterns arranged along a first direction, each of the plurality of unit patterns having a base surface portion, a plurality of inclined portions, the plurality of inclined portions being inclined upwardly from the base surface portion, and a top portion disposed at a top of the inclined portions, wherein a lower edge of a first inclined portion of each unit pattern of the plurality of unit patterns adjoins a lower edge of a second inclined portion of a neighboring unit pattern.

The inclined portions may include at least first and second inclined surfaces facing each other, upper and lower edges of each of the first and second inclined surfaces extending in a second direction perpendicular to the first direction, and a lower edge of the second inclined surface of a unit pattern adjoins a lower edge of a first inclined surface of a neighboring unit pattern in the first direction.

The adjoining lower edges of the first and second inclined surfaces of each pair of adjacent unit patterns in the first direction may define first bending lines along the second direction, the first and second inclined surfaces on both sides of each of the first bending lines contacting each other when the window panel is bent along the first bending lines.

The inclined portions may further include third and fourth inclined surfaces facing each other and adjoining the first and second inclined surfaces at either side thereof, the unit patterns being arranged in a matrix pattern with a plurality of rows and columns.

A lower edge of the third inclined surface of a unit pattern may adjoin a lower edge of the fourth inclined surface of a neighboring unit pattern in the second direction.

The adjoining lower edges of the first and second inclined surfaces of each pair of adjacent unit patterns in the first direction may define first bending lines in the second direction, the adjoining lower edges of the third and fourth inclined surfaces of each pair of adjacent unit patterns in the second direction may define second bending lines in the first direction, the first and second inclined surfaces on both sides of each of the first bending lines may contact each other when the window panel is bent along the first bending lines, and the third and fourth inclined surfaces on both sides of each of the second bending lines may contact each other when the window panel is bent along the second bending lines.

The top portion may include a flat surface parallel to the base surface portion.

The top portion may include a sharp peak.

The window panel may further include a reinforcing member at a bottom of the window panel.

The window panel may further include a cover layer cover the unit patterns.

According to other embodiments, there is also provided a display device, including a display panel, and a window panel on the display panel, the window panel having a plurality of unit patterns arranged along a first direction, and each of the plurality of unit patterns including a base surface portion, a plurality of inclined portions, the plurality of inclined portions being inclined upwardly from the base surface portion, and a top portion disposed at a top of the inclined portions, wherein a lower edge of a first inclined portion of each unit pattern of the plurality of unit patterns adjoins a lower edge of a second inclined portion of a neighboring unit pattern.

The display device may further include a cover layer covering the unit patterns.

A first height, a first width, and a first angle defined as a distance between the base surface portion and the top portion, a distance between a pair of adjacent unit patterns, and an angle between the pair of adjacent unit patterns, respectively, may satisfy the following equation:

$$w = \frac{2d}{\tan\left(\frac{180-\theta}{2}\right)}$$

where w, d, and θ denote the first width, the first distance, and the first angle, respectively.

The first angle may range from about 0.11 degrees to about 1.14 degrees.

The plurality of unit patterns may be arranged such that each of the unit patterns corresponds to at least one sub-pixel disposed therebelow, and the window panel may be bent to define a bending radius, a number of sub-pixels within the bending radius and the first angle satisfy the following equation:

$$\theta = \frac{180}{N/3}$$

where N denotes the number of sub-pixels within the bending radius.

The first angle and a horizontal width of the sub pixels may satisfy the following equation:

$$\theta = \frac{180}{\pi R} \times \frac{W}{3}$$

where R and W denote the bending radius and the horizontal width of the sub-pixels, respectively.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
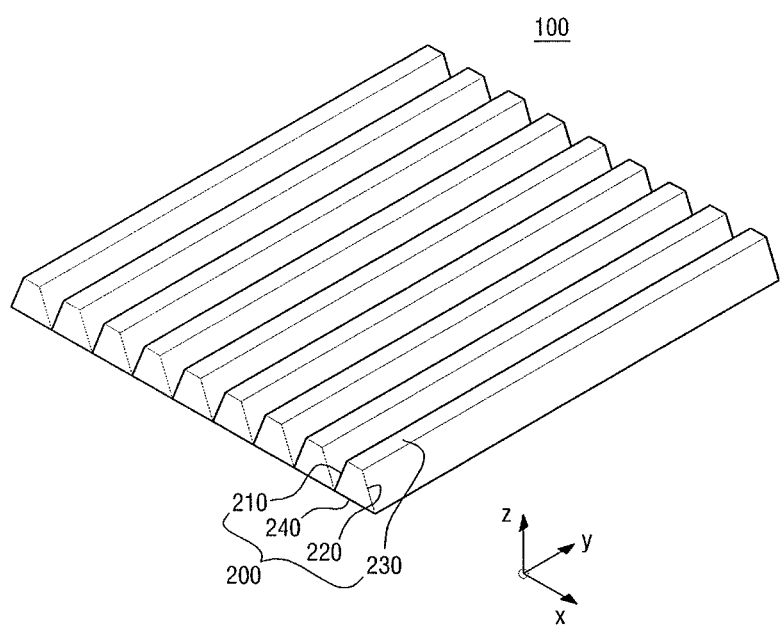
FIG. 1 illustrates a perspective view of a window panel according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments will be described with reference to the attached drawings. FIG. 1 illustrates a perspective view of a window panel according to an embodiment, FIG. 2 illustrates a plan view of the window panel of FIG. 1, and FIG. 3 illustrates a cross-sectional view taken along line I-I' of FIG. 2.

Figure 2:
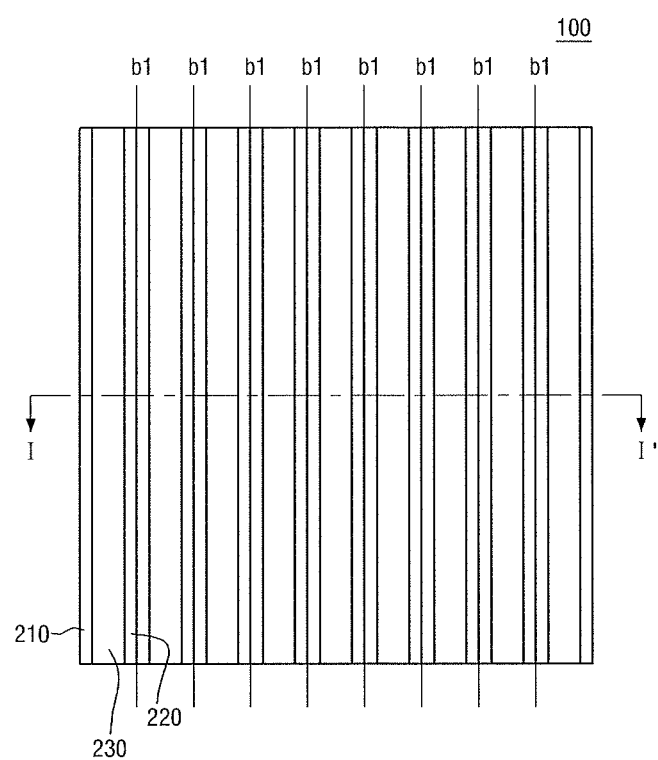
FIG. 2 illustrates a plan view of the window panel of FIG. 1.
Figure 3:
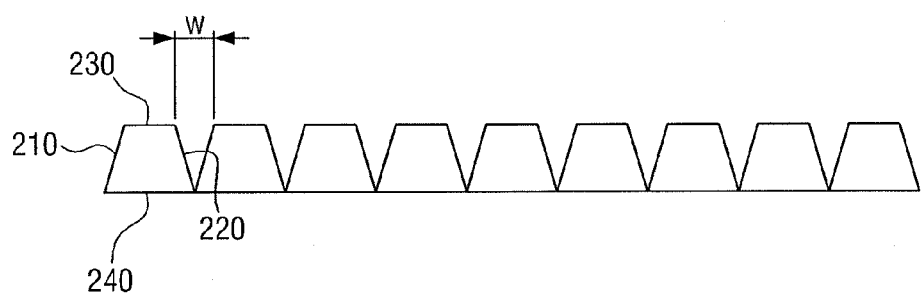
FIG. 3 illustrates a cross-sectional view taken along line I-I' of FIG. 2.

Referring to FIGS. 1 to 3, a window panel 100 may include a plurality of unit patterns 200. The unit patterns 200 are arranged along a first direction, e.g., the unit patterns 200 may be adjacent to each other along the first direction. Each of the unit patterns 200 includes a base surface portion 240, a pair of inclined portions 210 and 220 upwardly inclined from the base surface portion 240, and a top portion 230 disposed at the top of the inclined portions 210 and 220. A lower edge of the inclined portion 210 of a first unit pattern 200 may adjoin a lower edge of the inclined portion 220 of a second unit pattern 200, i.e., a neighboring unit pattern 200, and a lower edge of the inclined portion 220 of the first unit pattern 200 may adjoin a lower edge of the inclined portion 210 of a third unit pattern 200, i.e., another neighboring unit pattern 200. In other words, as illustrated in FIG. 1, lower edges of adjacent unit pattern 200 along the x-axis may contact each other.

The window panel 100 is a window panel of a display device, e.g., of a transparent flat panel, and may be formed of a transparent material, e.g., glass, plastic such as polyethyleneterephthalate (PET) or acryl, and the like. The term "transparent" or "transparency", as used herein, refers both to 100% transparency and to semi-transparency.

The window panel 100 may include the unit patterns 200, and the unit patterns 200 may be arranged along the first direction. The first direction may be an x-axis direction, as illustrated in FIG. 1.

Each of the unit patterns 200 may include the base surface portion 240. The base surface portion 240, which is a horizontally extended flat surface, may serve as a basis for defining the inclined portions 210 and 220 and the top portion 230 of each of the unit patterns 200.

Each of the unit patterns 200 may include the upwardly inclined portions 210 and 220. Each of the inclined portions 210 and 220 may include at least one inclined surface. In an example, the inclined portions 210 and 220 may include a first inclined surface 210 and a second inclined surface 220 which face each other. The inclined portions 210 and 220 will be described later in further detail.

The top portion 230 may be disposed at the top of the inclined portions 210 and 220. The top portion 230 may be at a predetermined vertical distance apart from the base surface portion 240. That is, the lower edges of the inclined portions 210 and 220 may adjoin the base surface portion 240, and the upper edges of the inclined portions 210 and 220 may adjoin the top portion 230. The inclined potions 210 and 220 may connect the base surface portion 240 and the top portion 230.

In a non-limiting example, the top portion 230 may be a flat surface. For example, the base surface portion 240 and the top portion 230 may be parallel to each other, so the inclined potions 210, 220 with the base and top portions 240, 230 may define a trapezoid-shaped unit pattern 200. In an example, the top portion 230 may extend in a second direction and may have a predetermined width. The top portions 230 of the unit patterns 200 may form, e.g., define, the surface of the window panel 100 together.

The first inclined surface 210 and the second inclined surface 220 may be disposed with the top portion 230 therebetween. The first inclined surface 210 and the second inclined surface 220 may face each other.

The upper and lower edges of each of the first inclined surface 210 and the second inclined surface 220 may extend in the second direction. That is, each of the first inclined surface 210 and the second inclined surface 220 may have a predetermined width and may extend in the second direction, e.g., along the y-axis direction.

The upper edge of the first inclined surface 210 may adjoin the top portion 230 on one side of the top portion 230, and the upper edge of the second inclined surface 220 may adjoin the top portion 230 on the other side of the top portion 230. That is, the top portion 230 may adjoin the first inclined surface 210 and the second inclined surface 220 on both sides thereof.

In an embodiment, the lower edge of the inclined portion 210 of the unit pattern 200 may adjoin the lower edge of the inclined portion 220 of a neighboring unit pattern 200, and the lower edge of the inclined portion 220 of the unit pattern 200 may adjoin the lower edge of the inclined portion 210 of another neighboring unit pattern 200.

In detail, for example, in response to the inclined portions 210 and 220 of each of the unit patterns 200 being the first inclined surface 210 and the second inclined surface 220, the lower edge of the first inclined surface 210 of the unit pattern 200 may adjoin the lower edge of the second inclined surface 220 of the neighboring unit pattern 200 in the first direction, and the lower edge of the second inclined surface 220 of the predetermined unit pattern 200 may adjoin the lower edge of the first inclined surface 210 of another neighboring unit pattern 200 in the first direction. For example, as illustrated in FIGS. 1 and 3, a plurality of trapezoid-shaped unit patterns 200 may be connected to each other at lower edges thereof to define a substantially uniform and continuous bottom surface, i.e., defined by a plurality of base surface portions 240, and a top surface having discontinuous portions, i.e., defined by a plurality of top portions 230 spaced apart from each other. For example, a plurality of fold lines may be formed along the second direction, e.g., along a contact line between adjacent and contacting lower edges of adjacent unit patterns 200. For convenience, as illustrated in FIG. 2, a plurality of lines extended from the plurality of fold lines, respectively, may be defined as first bending lines b1.

Since the unit patterns 200 are arranged such that the lower edge of the second inclined surface 220 of one unit pattern 200 may adjoin, e.g., contact, the lower edge of the first inclined surface 220 of a neighboring unit pattern 200 in the first direction, the top portion 230 of one unit pattern 200 may be a predetermined distance apart from the top portion of the neighboring unit pattern 200. Referring to FIG. 3, a distance between the top portions 230 of a pair of adjacent unit patterns 200 along the first direction, i.e., a first width w, may be relatively much smaller than a width of a single top portion 230 of the unit patterns 200 along the first direction. In an example, the first width w may be smaller than the width of particles, e.g., dust particles, that may be present on the window panel 100. According to this example, when the first width w is smaller than the width of particles, it is possible to prevent any foreign materials, e.g., dust particles, from being stuck between adjacent unit patterns 200.

Figure 4:
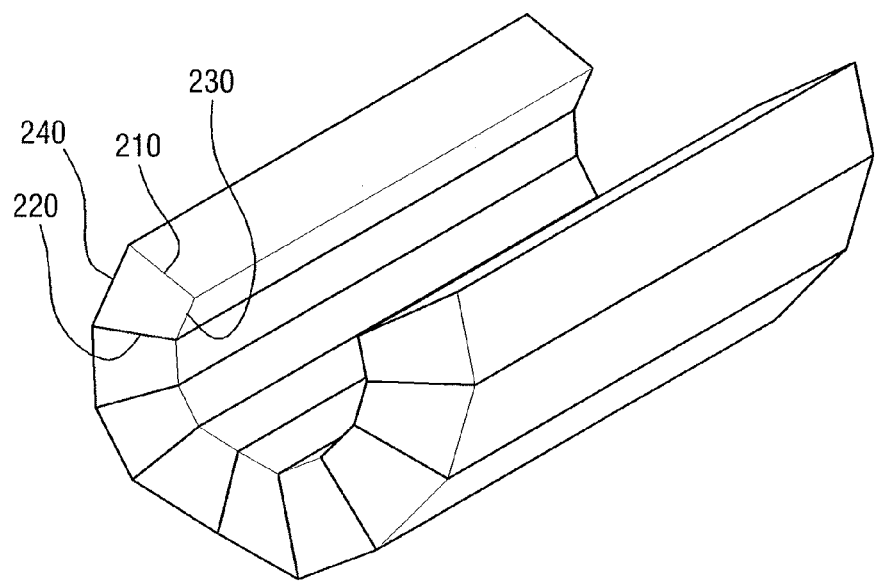
FIG. 4 illustrates another perspective view of the window panel of FIG. 1.
Figure 5:
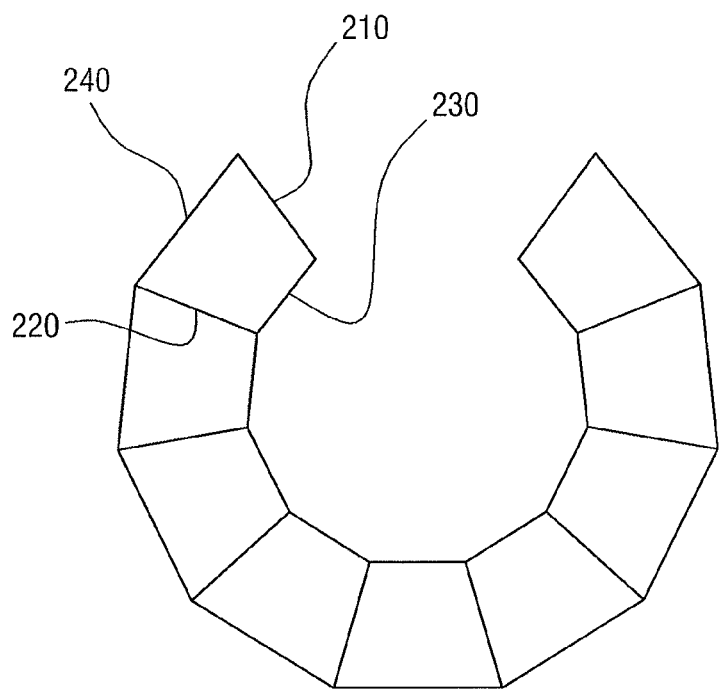
FIG. 5 illustrates a cross-sectional view of the window panel of FIG. 4.

An operating method of the window panel 100 will hereinafter be described with reference to FIGS. 4 and 5. FIG. 4 illustrates another perspective view of the window panel 100, and FIG. 5 illustrates a cross-sectional view of the window panel 100.

As described above, a plurality of fold lines may be formed in the window panel 100 by arranging the unit patterns 200 such that the lower edge of the second inclined surface 220 of one unit pattern 200 may adjoin the lower edge of the first inclined surface 220 of a neighboring unit pattern 200 in the first direction, and the first bending lines b1 may be defined as extensions of the fold lines. That is, the first bending lines b1 may be defined on the window panel 100 to be a predetermined distance apart from one another and to extend in parallel with one another. The first bending lines b1 may extend in the second direction.

In response to potential external force applied to the window panel 100, as illustrated in FIG. 4, the window panel 100 may be folded. In detail, the window panel 100 may be folded along the first bending lines b1, in part because the thickness of the first bending lines b1 is much smaller than the thickness of the unit patterns 200. That is, in response to external force applied to the window panel 100, the window panel 100 may be at least partially folded along the first bending lines b1, which are relatively thinner than the unit patterns 200 along the z-axis. The window panel 100 may be folded along the first bending lines b1 for various other reasons than the first bending lines b1 being relatively thinner than the unit patterns 200, e.g., because of inherent properties of the material of the window panel 100.

When the window panel 100 is folded along the first bending lines b1, opposite inclined surfaces of adjacent unit patterns 200 on opposite sides of each bending line b1 move toward each other to adjoin each other. That is, the second inclined surface 220 of a unit pattern 200 may adjoin the first inclined surface 210 of a neighboring unit pattern 200 in the first direction. For example, as illustrated in FIGS. 4-5, adjacent unit patterns 200 may bend toward each other along the first bending lines b1, so the second inclined surface 220 of one unit pattern 200 may be positioned to be flush against and in direct contact with the first inclined surface 210 of a neighboring unit pattern 200.

Further, when the window panel 100 is folded along the first bending lines b1, a first side of the top portion 230 of a unit pattern 200 may adjoin a second side of the top portion 230 of a neighboring unit pattern 200 in the first direction. That is, the distance between the top portions 230 of a pair of adjacent unit patterns 200 in the first direction may substantially become zero.

Window panels according to other embodiments will be described hereinafter. Throughout this disclosure, like reference numerals may indicate like elements, and thus, descriptions thereof will be omitted, or at least simplified.

Figure 6:
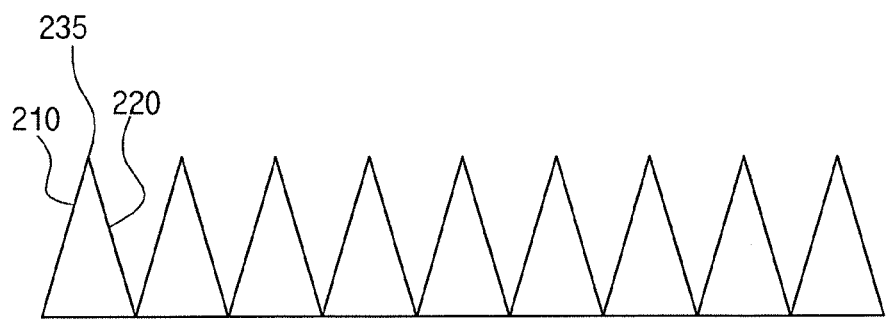
FIG. 6 illustrates a cross-sectional view of a window panel according to another embodiment.

FIG. 6 illustrates a cross-sectional view of a window panel according to another embodiment.

Referring to FIG. 6, a window panel according to another embodiment, unlike the window panel 100 of FIG. 3, has a plurality of unit patterns with sharp peaks 235 as top portions thereof. For example, the unit patterns in FIG. 6 may have a triangular cross-section. The peaks 235 may extend in the second direction. Accordingly, when viewed from above, the peaks 235 may appear to be in the shape of lines extending in the second direction.

Figure 7:
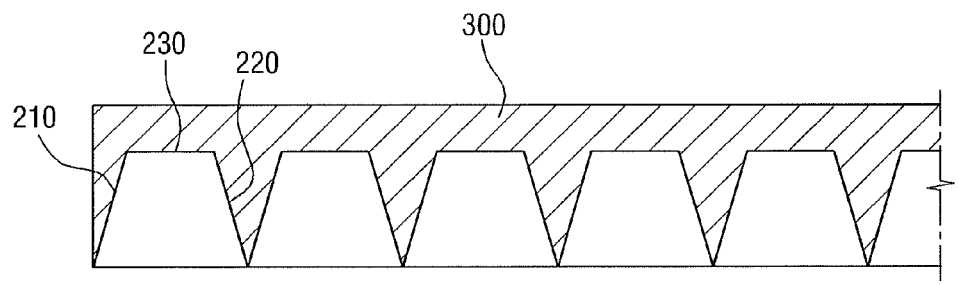
FIG. 7 illustrates a cross-sectional view of a window panel according to another embodiment.

FIG. 7 illustrates a cross-sectional view of a window panel according to another embodiment.

Referring to FIG. 7, a window panel according to another embodiment, unlike the window panel 100 of FIG. 3, further includes a cover layer 300 disposed over the plurality of unit patterns 200. The cover layer 300 may be disposed on the surface of the window panel to cover the unit patterns 200. In detail, the cover layer 300 may cover, e.g., overlap, the top portions 230, the first inclined surfaces 210, and the second inclined surfaces 220 of the unit patterns 200.

The cover layer 300 may be formed of a low-modulus material. In a non-limiting example, the cover layer 300 may be formed of polydimethylsiloxane (PDMS).

As the cover layer 300 is formed of a low-modulus material, the presence of the cover layer 300 on and between the unit patterns 200 may not affect much the folding of the window panel. That is, due to the properties of the material of the cover layer 300, the window panel may still be able to be folded along the first bending lines b1.

In a non-limiting example, the top surface of the cover layer 300 may be flat. In another non-limiting example, the cover layer 300 may be formed to include one or more recesses.

When the cover layer 300 is formed to cover the window panel, the rigidity of the surface of the window panel may be improved. That is, the cover layer 300 may not only maintain the rigidity of the surface of the window panel, but also prevent foreign materials from being stuck between the unit patterns 200.

Figure 8:
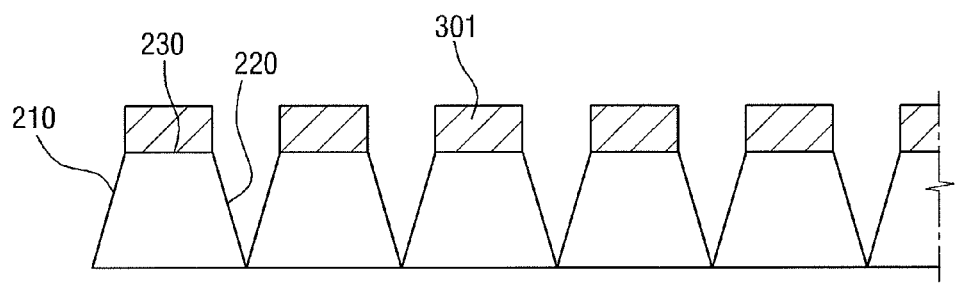
FIG. 8 illustrates a cross-sectional view of a window panel according to another embodiment.

FIG. 8 illustrates a cross-sectional view of a window panel according to another embodiment.

Referring to FIG. 8, a window panel according to another embodiment, unlike the window panel of FIG. 7, includes a plurality of cover layers 301 which cover the top portions 230 of the plurality of unit patterns 200. In detail, the cover layers 301 may be a plurality of discrete and separate layers formed to cover only the top portions 230. That is, the cover layers 301 may extend in the second direction along with the top portions 230, and may cover the top portions 230. As a result, a pair of adjacent cover layers 301 may be a predetermined distance apart from each other along the first direction.

Figure 9:
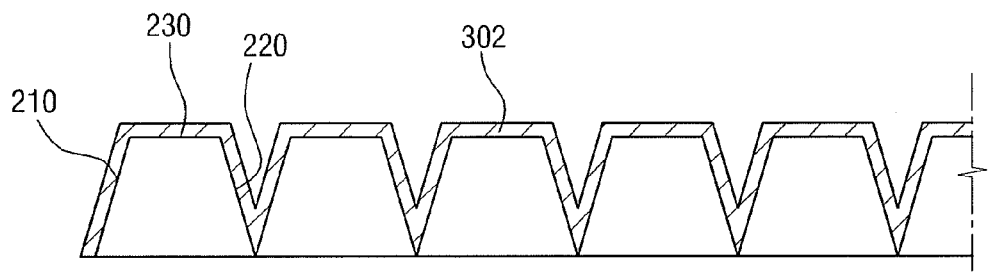
FIG. 9 illustrates a cross-sectional view of a window panel according to another embodiment.

FIG. 9 illustrates a cross-sectional view of a window panel according to another embodiment.

Referring to FIG. 9, a window panel according to another embodiment, unlike the window panel of FIG. 7, includes a cover layer 302 which covers the plurality of unit patterns 200 and is conformally formed on the unit patterns 200.

In detail, the cover layer 302 may, e.g., continuously, cover all the unit patterns 200. A top surface of the cover layer 302 may conform to the shape of the top surface of an array of the unit patterns 200. That is, parts of the cover layer 302 formed on the top portions 230 of the unit patterns 200 may be flat, and parts of the cover layer 302 formed between the unit patterns 200 may be recessed and may be spaced at regular intervals. That is, the flat parts and the recessed parts of the cover layer 302 may be alternately arranged on the window panel according to the arrangement of the unit patterns 200.

Figure 10:
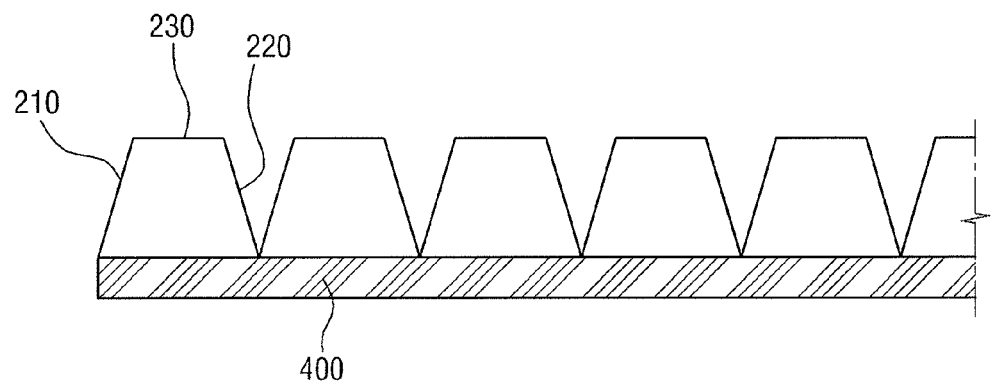
FIG. 10 illustrates a cross-sectional view of a window panel according to another embodiment.

FIG. 10 illustrates a cross-sectional view of a window panel according to another embodiment.

Referring to FIG. 10, a window panel according to another embodiment, unlike the window panel of FIG. 5, further includes a reinforcing member 400 which is disposed at a bottom of the window panel.

In detail, the reinforcing member 400 may be disposed at the bottom of the window panel. In a non-limiting example, the reinforcing member 400 may be disposed on the entire bottom surface of the window panel, e.g., to directly contact and overlap all the base surface portions 240 of the unit patterns 200. In another non-limiting example, the reinforcing member 400 may be disposed on at least a portion of the bottom surface of the window panel.

In a non-limiting example, the bottom of the window panel and the reinforcing member 400 may be placed in direct contact with each other, as illustrated in FIG. 10. In another non-limiting example, the reinforcing member 400 may be disposed at the bottom of the window panel with one or more intermediate layers interposed therebetween for various functions.

In a non-limiting example, the reinforcing member 400 may be formed of a plastic material. In another non-limiting example, the reinforcing member 400 may be formed of a flexible material.

When the reinforcing member 400 is disposed at the bottom of the window panel, any potential reduction in the rigidity of the window panel, e.g., in areas along the first bending lines b1, caused by the folding of the window panel may be compensated for.

Figure 11:
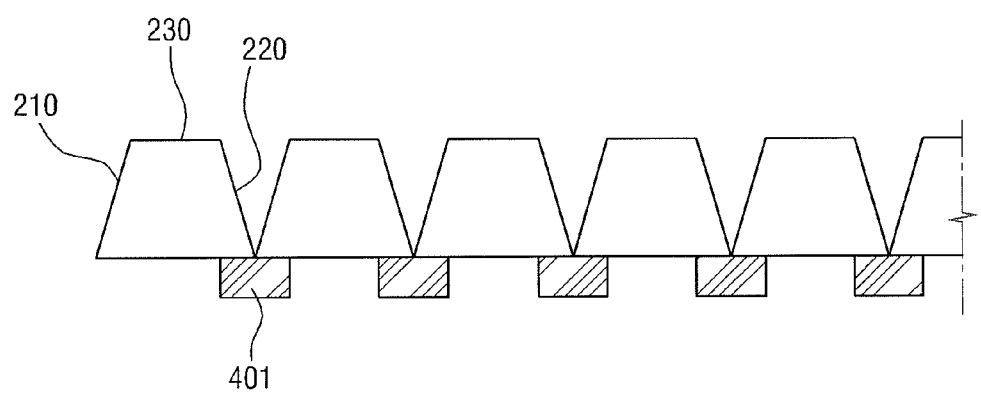
FIG. 11 illustrates a cross-sectional view of a window panel according to another embodiment.

FIG. 11 illustrates a cross-sectional view of a window panel according to another embodiment.

Referring to FIG. 11, a window panel according to another embodiment, unlike the window panel of FIG. 10, includes a plurality of reinforcing members 401 which are arranged to extend along the first bending lines b1.

The reinforcing members 401 may be disposed only on a portion of the bottom surface of the window panel. In a non-limiting example, the reinforcing members 401 may be formed to extend along and overlap the first bending lines b1. That is, the reinforcing members 401 may extend in the second direction, and may overlap the first bending lines b1.

When the reinforcing members 401 are formed to overlap the first bending lines b1, any potential reduction in the rigidity of the window panel, e.g., in areas along the first bending lines b1, caused by the folding of the window panel may be compensated for.

Figure 12:
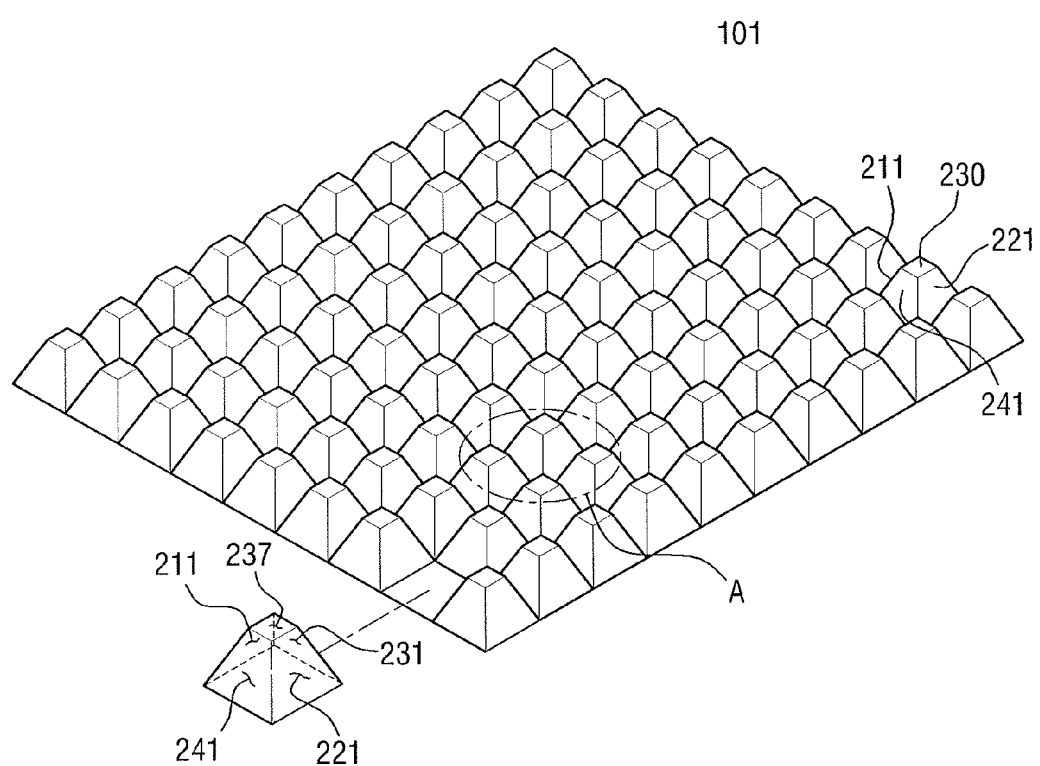
FIG. 12 illustrates a perspective view of a window panel according to another embodiment.
Figure 13:
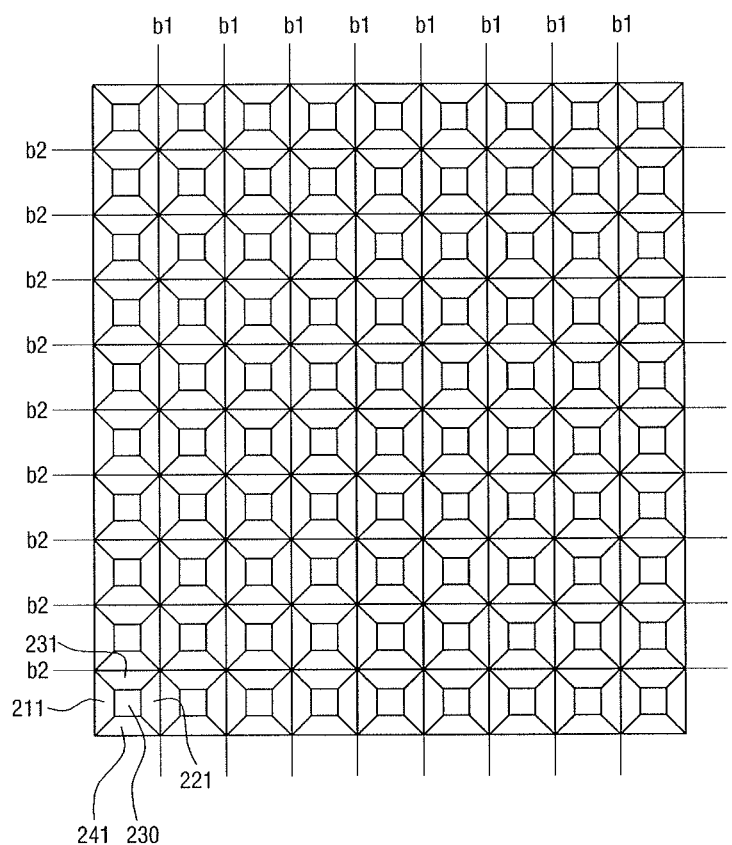
FIG. 13 illustrates a plan view of the window panel of FIG. 12.
Figure 14:
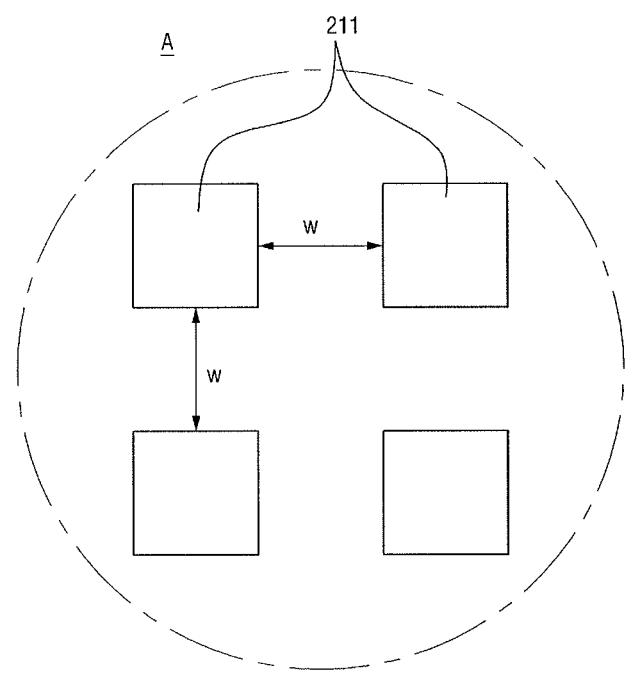
FIG. 14 illustrates a partial enlarged view of portion A of FIG. 12.

FIG. 12 illustrates a perspective view of a window panel according to another embodiment, FIG. 13 illustrates a plan view of the window panel of FIG. 12, and FIG. 14 illustrates a partial enlarged view of portion A of FIG. 12.

Referring to FIGS. 12 and 13, a window panel according to another embodiment, unlike the window panel 100 of FIG. 1, includes a plurality of unit patterns 201 which are arranged in a matrix pattern with a plurality of rows and columns. Each unit pattern 201 may include first and second inclined surfaces 211 and 221 and third and fourth inclined surfaces 231 and 241 that adjoin the first and second inclined surfaces 211 and 221 and face each other.

In a non-limiting example, the unit patterns 201 may be arranged in a matrix pattern with a plurality of rows and columns. In this example, a top portion 237 of each of the unit patterns 201 may be a rectangular flat surface, and four sides of the top portion 237 may adjoin the upper edges of the first, second, third, and fourth inclined surfaces 211, 221, 231, and 241, respectively. For convenience, the four sides of the top portion 237 that adjoin the first, second, third, and fourth inclined surfaces 211, 221, 231, and 241, respectively, will hereinafter be referred to as first, second, third, and fourth sides, respectively. That is, the third and fourth inclined surfaces 231 and 241 may face each other, and may adjoin both the first and second inclined surfaces 211 and 221 on either side thereof.

The lower edge of the third inclined surface 231 of the unit pattern 201 may adjoin the lower edge of the fourth inclined surface 241 of a neighboring unit pattern 201 in the second direction. In detail, the unit pattern 201 may adjoin at least two other unit patterns 201. That is, a unit pattern 201 in a central area of the window panel may adjoin four other unit patterns 201, a unit pattern 201 on one edge of the window panel may adjoin three other unit patterns 201, and a unit pattern 201 at one corner of the window panel may adjoin two other unit patterns 201.

That is, the lower edge of the first inclined surface 211 of a unit pattern 201 may adjoin the lower edge of the second inclined surface 221 of a neighboring unit pattern 201 in the first direction, and the lower edge of the third inclined surface 231 of a unit pattern 201 may adjoin the lower edge of the fourth inclined surface 241 of a neighboring unit pattern 201 in the second direction.

For convenience, lines extended from fold lines formed by the adjoining lower edges of pairs of adjacent unit patterns 201 in the first direction may be defined as the first bending lines b1. Lines extended from fold lines formed by the adjoining lower edges of pairs of adjacent unit patterns 201 in the second direction may be defined as second bending lines b2.

A plurality of first bending lines b1 and a plurality of second bending lines b2 may be defined on the window panel. The first bending lines b1 may extend in the second direction, and may be a predetermined distance apart from one another. The second bending lines b2 may extend in the first direction, and may be a predetermined distance from one another. As a result, the first bending lines b1 and the second bending lines b2 may intersect each other, e.g., define a grid.

Referring to FIG. 14, the top portion 237 of a unit pattern 201 may be spaced from the top portion 237 of a neighboring unit pattern 201 by a predetermined distance. In a non-limiting example, the distance between a pair of adjacent unit patterns 201 in the first direction may substantially be the same as the distance between a pair of adjacent unit patterns 201 in the second direction. In another non-limiting example, the distance between a pair of adjacent unit patterns 201 in the first direction may be different from the distance between a pair of adjacent unit patterns 201 in the second direction.

Figure 15:
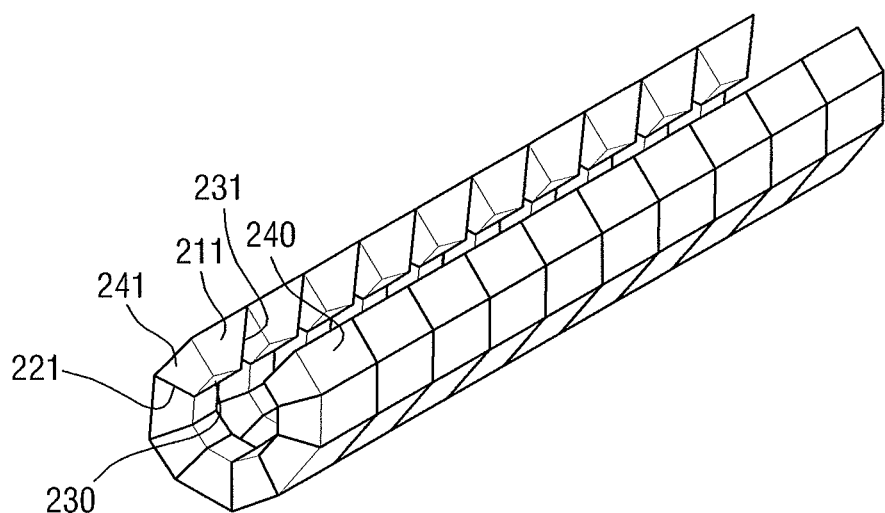
FIGS. 15 and 16 illustrate perspective views of examples of the window panel of FIG. 12 in a bent shape thereof.
Figure 16:
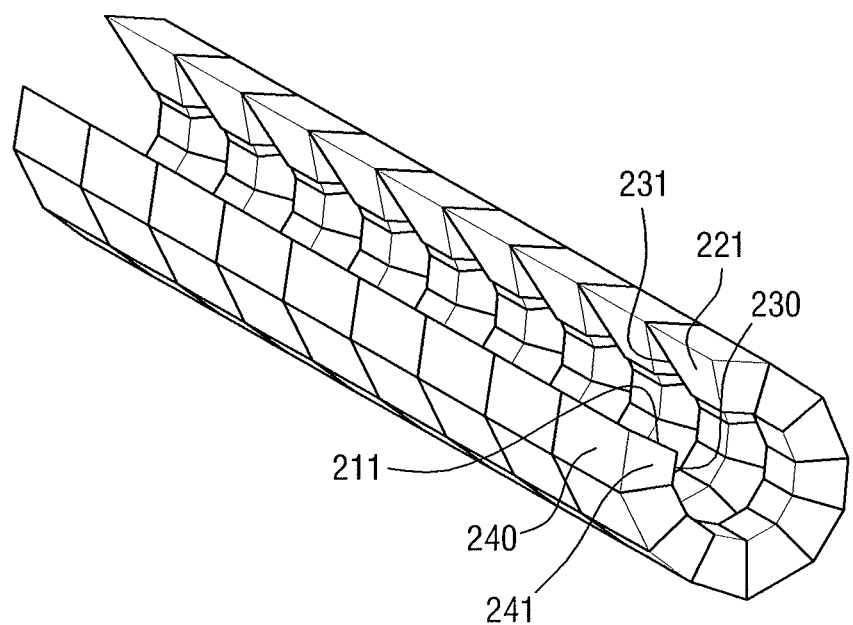

An operating method of the window panel of FIGS. 12-14 will be described hereinafter with reference to FIGS. 15 and 16. FIGS. 15 and 16 illustrate perspective views of the window panel of FIG. 12 bent along the first and second bending lines b1 and b2, respectively.

Referring to FIGS. 15 and 16, when external force is applied to the window panel of FIG. 12, the window panel of FIG. 12 may be bent along a plurality of bending lines.

In detail, referring to FIG. 15, when the window panel of FIG. 12 is bent along the first bending lines b1, first and second inclined surfaces 211 and 221 on either side of the first bending line b1 may contact each other. That is, the first inclined surface 221 the unit pattern 201 may adjoin the second inclined surface 221 of a neighboring unit pattern 201 in the first direction. The second side of the top portion 237 of the unit pattern 201 may adjoin the first side of the top portion 237 of a neighboring unit pattern 201 in the first direction.

Similarly, referring to FIG. 16, when the window panel of FIG. 12 is bent along the second bending lines b2, third and fourth inclined surfaces 241 on either side of the second bending line b2 may contact each other. That is, the third inclined surface 231 of the unit pattern 201 may adjoin the fourth inclined surface 241 of a neighboring unit pattern 201 in the second direction.

Figure 17:
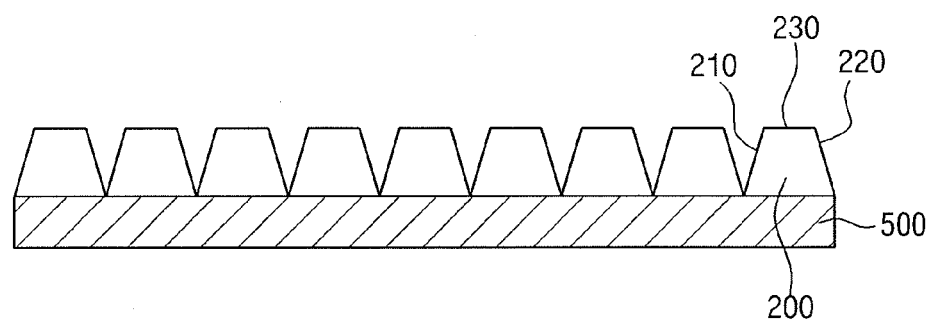
FIG. 17 illustrates a cross-sectional view of a display device according to an embodiment.

FIG. 17 illustrates a cross-sectional view of a display device according to an embodiment.

Referring to FIG. 17, a display device according to an embodiment may include a display panel 500 and a window panel disposed on the display panel 500. The window panel includes the plurality of unit patterns 200 which are arranged along the first direction. Each of the unit patterns 200 includes the base surface portion 240, the pair of inclined portions 210 and 220 upwardly inclined from the base surface portion 240, and the top portion 230 disposed at the top of the inclined portions 210 and 220. The lower edge of the inclined portion 210 of the unit pattern 200 may adjoin the lower edge of the inclined portion 220 of a neighboring unit pattern 200, and the lower edge of the inclined portion 220 of the unit pattern 200 may adjoin the lower edge of the inclined portion 210 of another neighboring unit pattern 200.

The window panel may substantially be the same as the window panels of the previous embodiments of FIGS. 1-16. Thus, a detailed description thereof will be omitted.

The display panel 500 may be disposed below the window panel. In a non-limiting example, the display panel 500 may include a liquid crystal display (LCD) panel, an electrophoretic display panel, an organic light emitting diode (OLED) panel, a light-emitting diode (LED) panel, an inorganic electro-luminescent (EL) display panel, a field emission display (FED) panel, a surface-conduction electron-emitter (SED) display panel, a plasma display panel (PDP), or a cathode ray tube (CRT) display panel. In another non-limiting example, the display panel 500 may be a flexible display panel with transparent electrodes, e.g., formed of an indium tin oxide (ITO) film. That is, examples of the display panel 500 may include any suitable types of display panels, e.g., not only including those currently available but also including those to be developed.

In a non-limiting example, the window panel may be disposed on the display panel 500. In another non-limiting example, the window panel may be disposed on the display panel 500 with one or more intermediate layers interposed therebetween for various functions. For example, the intermediate layers may include, but are not limited to, a touch panel and/or a polarizing plate.

Figure 18:
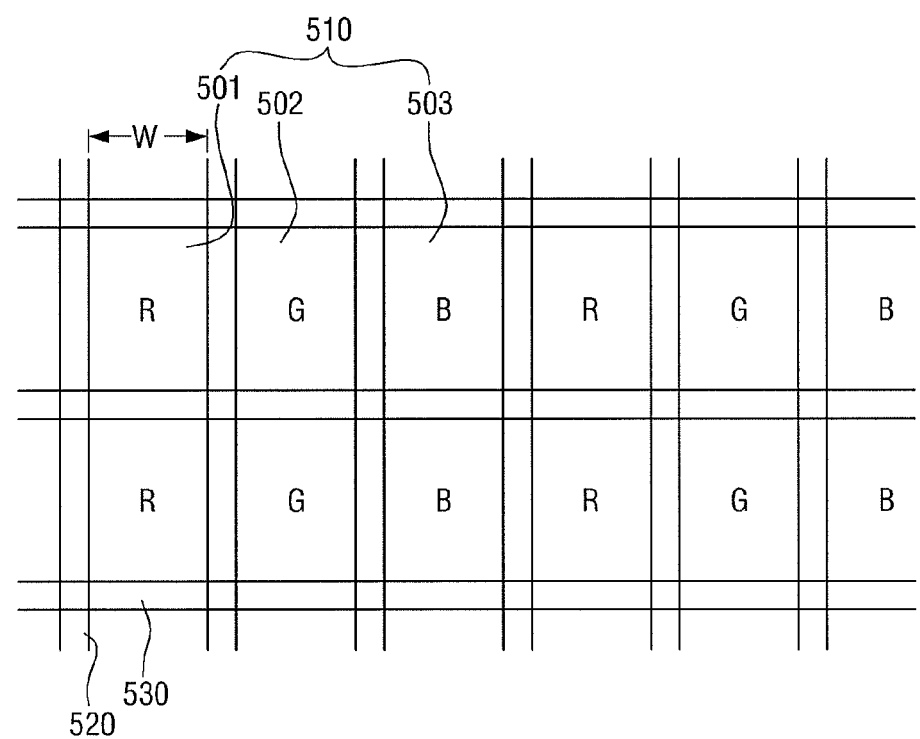
FIG. 18 illustrates a partial enlarged view of the display panel of FIG. 17.

FIG. 18 illustrates a partial enlarged view of the display panel 500.

Referring to FIG. 18, the display panel 500 may include a plurality of gate lines 530 which extend in the first direction and a plurality of data lines 520 which intersect the gate lines 530. For convenience, regions defined by the gate lines 530 and the data lines 520 will hereinafter be referred to as sub-pixels, and a set of three adjacent red, green, and blue sub-pixels 501, 502, and 503 may be defined as a pixel 510. That is, a single pixel 510 may include a single red sub-pixel 501, a single green sub-pixel 502, and a single blue sub-pixel 503. In a non-limiting example, a plurality of sub-pixels of the same type may be arranged along a vertical direction, and three different sub-pixels may be alternately arranged along a horizontal direction, as illustrated in FIG. 18.

Figure 19:
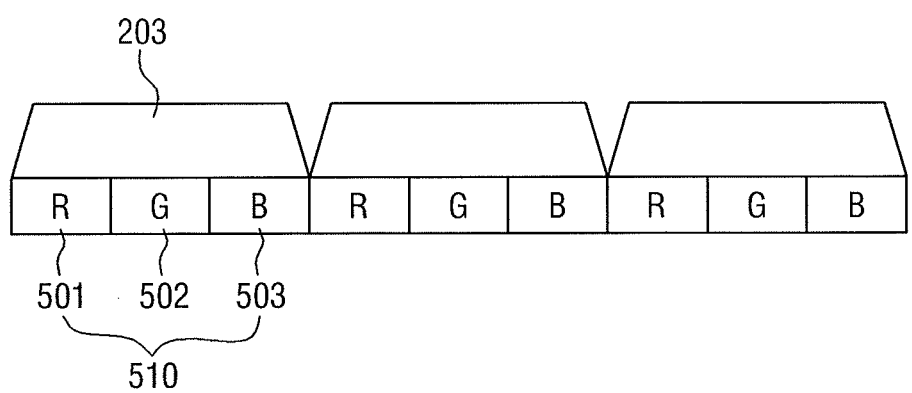
FIG. 19 illustrates a schematic cross-sectional view of a display device according to another embodiment.

FIG. 19 illustrates a schematic cross-sectional view of a display device according to another embodiment.

Referring to FIG. 19, a plurality of unit patterns 203 may be formed to correspond to a plurality of pixels 510, respectively. That is, the width of the unit patterns 203 may substantially be the same as the width of the pixels 510. The unit patterns 203 may overlap their respective sets of three sub-pixels.

In a non-limiting example, in response to the unit patterns 203 extending in the second direction, the unit patterns 203 may overlap the pixels 510, respectively, which are arranged along the second direction. In this example, the width of the unit patterns 203 may substantially be the same as the width of the pixels 510, e.g., the width of one unit pattern 203 may equal the width of one pixel 510.

In another non-limiting example, in response to the unit patterns 203 being arranged in a matrix and each of the unit patterns 203 including first to fourth inclined surfaces, the length of the unit patterns 203 in the first direction may substantially be the same as the length of the pixels 510 in the first direction, and the length of the unit patterns 203 in the second direction may substantially be the same as the length of the pixels 510 in the second direction. That is, the area of the unit patterns 203 may substantially be the same as the area of the pixels 510.

Figure 20:
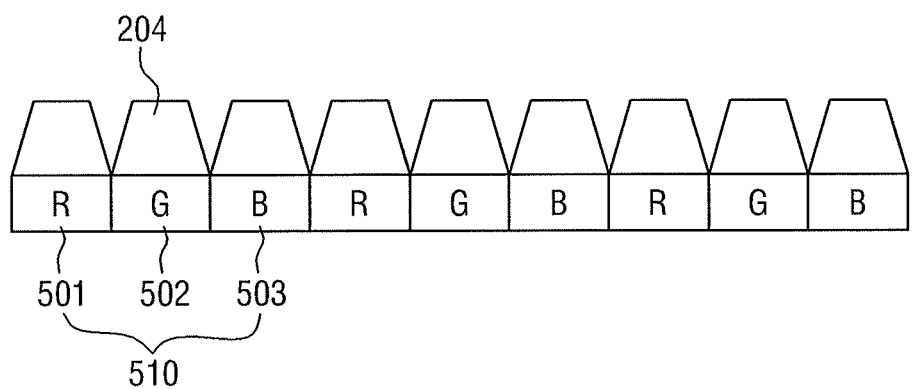
FIG. 20 illustrates a cross-sectional view of a variation of the display device of FIG. 19.

FIG. 20 illustrates a cross-sectional view of a variation of the display device of FIG. 19.

Referring to FIG. 20, a display device may include a plurality of unit patterns 204 which are arranged to correspond to a plurality of sub-pixels, respectively. That is, the width of the unit patterns 204 may substantially be the same as the width of the sub-pixels e.g., the width of one unit pattern 204 may equal the width of one sub-pixel.

In a non-limiting example, in response to the unit patterns 204 extending along the second direction, the unit patterns 204 may overlap the sub-pixels, respectively. In this example, the width of the unit patterns 204 may substantially be the same as the width of the sub-pixels.

In another non-limiting example, in response to the unit patterns 204 being arranged in a matrix and each of the unit patterns 204 including first to fourth inclined surfaces, the length of the unit patterns 204 in the first direction may substantially be the same as the length of the sub-pixels in the first direction, and the length of the unit patterns 204 in the second direction may substantially be the same as the length of the sub-pixels in the second direction. That is, the area of the unit patterns 204 may substantially be the same as the area of the sub-pixels.

Figure 21:
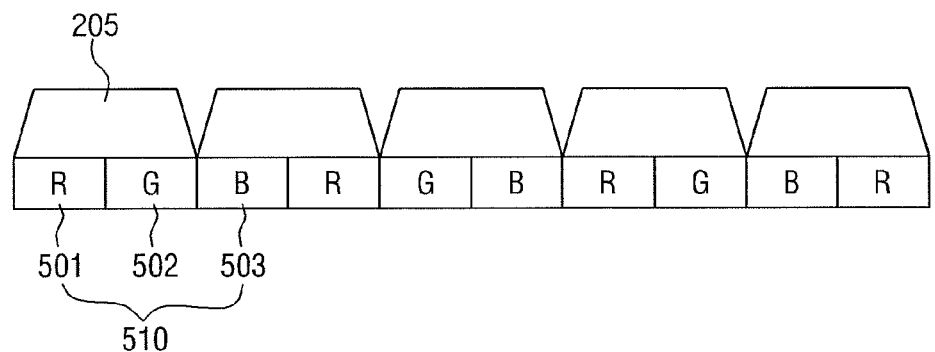
FIG. 21 illustrates a cross-sectional view of another variation of the display device of FIG. 19.

FIG. 21 illustrates a cross-sectional view of a variation of the display device of FIG. 19.

Referring to FIG. 21, a display device may include a plurality of unit patterns 205 which are arranged such that each of the unit patterns 205 may correspond to two sub-pixels. That is, the width of the unit patterns 205 may substantially be the same as a combined width of two sub-pixels.

In a non-limiting example, in response to the unit patterns 205 extending along the second direction, each of the unit patterns 205 may overlap a plurality of sub-pixels that are arranged in two rows along the second direction. In this example, the width of the unit patterns 205 may substantially be the same as the combined width of two sub-pixels.

In another non-limiting example, in response to the unit patterns 205 being arranged in a matrix and each of the unit patterns 205 including first to fourth inclined surfaces, the length of the unit patterns 205 in the first direction may substantially be the same as the combined length of two sub-pixels in the first direction, and the length of the unit patterns 205 in the second direction may substantially be the same as the combined length of two sub-pixels in the second direction. That is, the area of the unit patterns 205 may substantially be the same as the combined area of two sub-pixels.

Figure 22:
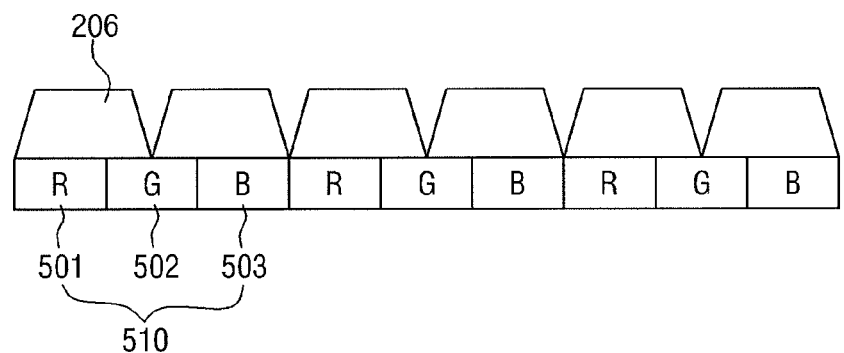
FIG. 22 illustrates a cross-sectional view of another variation of the display device of FIG. 19.

FIG. 22 illustrates a cross-sectional view of a variation of the display device of FIG. 19.

Referring to FIG. 22, a display device may include a plurality of unit patterns 206 which are arranged such that each of the unit patterns 206 may correspond to one sub-pixel and part of another neighboring sub-pixel. That is, the width of the unit patterns 206 may substantially be the same as the combined width of one sub-pixel and part of another neighboring sub-pixel, e.g., the width of one unit pattern 206 may equal the width of a sub-pixel and a half. In a non-limiting example, the combined width of two unit patterns 206 may be the same as a combined width of three sub-pixels of each pixel 510, as illustrated in FIG. 22.

The relationship between the elements of a window panel according to embodiments will hereinafter be described with reference to FIGS. 23 to 25 and Table 1.

Figure 23:
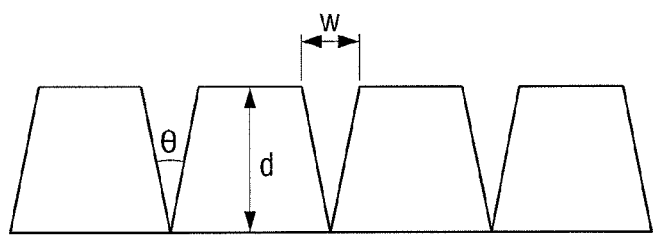
FIG. 23 illustrates a partial cross-sectional view of a window panel according to embodiments.

FIG. 23 illustrates a partial cross-sectional view of a window panel according to embodiments. FIG. 24 illustrates a graph showing the relationship between a first width w and a first height d, and FIG. 25 illustrates a diagram of a window panel according to embodiments.

For convenience, referring to FIG. 23, the first height d, the first width w, and a first angle θ are defined as a distance between a base surface portion and a top portion of each unit pattern, the distance between the top portions of a pair of adjacent unit patterns, and the angle between a pair of adjacent unit patterns, respectively.

In a non-limiting example, the first width w and the first height d may be directly proportional to each other. In a non-limiting example, the first width w, the first height d, and the first angle θ may satisfy Equation (1) below:

$$w = \frac{2d}{\tan\left(\frac{180-\theta}{2}\right)} \quad \text{Equation (1)}$$

Figure 24:
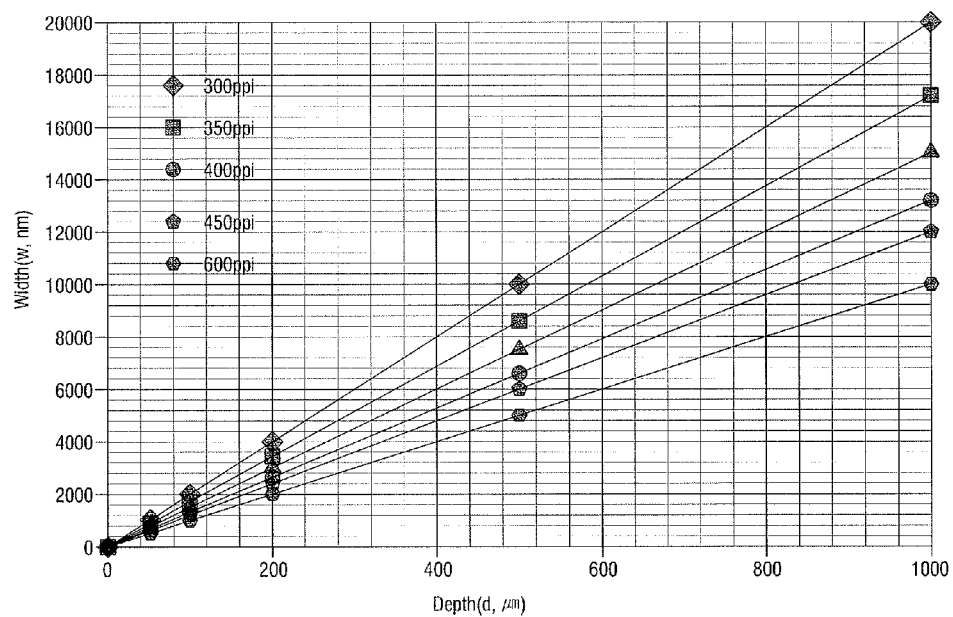
FIG. 24 illustrates a graph showing the relationship between a first width w and a first height d.
Figure 25:
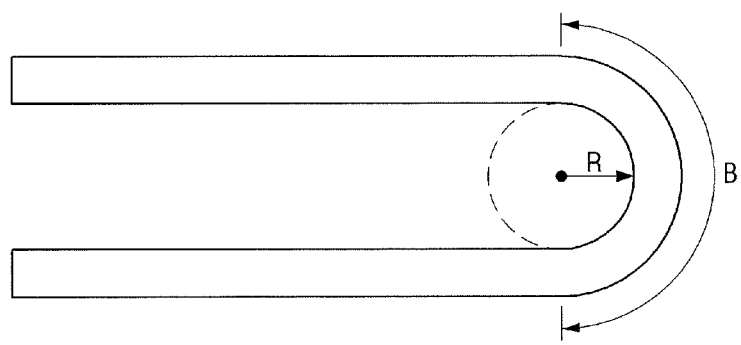
FIG. 25 illustrates a diagram of a window panel according to embodiments.

That is, when the first angle θ is uniform, the first width w may be determined by multiplying the first height d by a predetermined constant value, which will become more apparent in FIG. 24.

Referring to FIG. 24, the first width w and the first height d may be directly proportional to each other, but the slope of the graph of the relationship between the first width w and the first height d may vary depending on pixels per inch (PPI). That is, the higher the PPI level, the steeper the slope of the graph of the relationship between the first width w and the first height d. FIG. 24 illustrates graphs for 300 ppi, 350 ppi, 400 ppi, 450 ppi, 500 ppi and 600 ppi, but the present inventive concept is not limited to the PPI levels set forth herein.

The first angle θ and a number N of sub-pixels within a bending radius (R) may be defined by Equation (2).

$$\theta = \frac{180}{N/3} = \frac{180}{\pi R} \times \frac{W}{3} \quad \text{Equation (2)}$$

In Equation (2), W denotes a horizontal width of sub-pixels, as indicated in FIG. 13. Referring to FIG. 25, the bending radius R may be defined as the radius of an imaginary circle having the same curvature as a curved line formed by a bent window panel, and the number N of sub-pixels within the bending radius R may be the number of sub-pixels in area B of the bent window panel.

The greater the number of sub-pixels N within the bending radius R, the smaller the first angle θ.

The horizontal width W of Equation (2) may be defined by Equation (3):

$$W = \frac{25.4}{\sqrt{2}} \frac{1}{ppi} \qquad \text{Equation (3)}$$

The relationship between the number N of sub-pixels within the bending radius R and the first angle θ will become more apparent with reference to Table 1 below. Table 1 presents experimental data showing the relationship between the number N of sub-pixels within the bending radius R and the first angle θ.

TABLE 1

|   | PPI | | | | | |
|---|---|---|---|---|---|---|
|   | 300 | 350 | 400 | 450 | 500 | 600 |
| At R = 1 mm | | | | | | |
| N | 157 | 184 | 210 | 236 | 262 | 315 |
| θ | 1.14 | 0.98 | 0.86 | 0.76 | 0.69 | 0.57 |
| At R = 3 mm | | | | | | |
| N | 472 | 551 | 630 | 708 | 787 | 945 |
| θ | 0.38 | 0.33 | 0.29 | 0.25 | 0.23 | 0.19 |
| At R = 5 mm | | | | | | |
| N | 787 | 918 | 1049 | 1181 | 1312 | 1574 |
| θ | 0.23 | 0.20 | 0.17 | 0.15 | 0.14 | 0.11 |

Referring to Table 1, the greater the number N of sub-pixels within the bending radius R, the smaller the first angle θ. The first angle θ may range from 0.11 degrees to 1.14 degrees depending on the number N of sub-pixels within the bending radius R. By reducing the first angle θ, the first width w may be reduced, and as a result, foreign materials may be prevented from being be stuck between pairs of adjacent unit patterns. In addition, the bending performance and stability of a window panel may be improved.

By way of summary and review, a conventional bendable or foldable display device requires not only a bendable or foldable display panel, but also a bendable or foldable window panel. However, since window panels are generally expected to provide a certain level of rigidity, it may be difficult to provide window panels that are bendable or foldable.

In contrast, exemplary embodiments provide a window panel with a plurality of unit patterns connected to each other only at lower edges, and therefore, being capable of being bent or folded along the connection lines of the lower edges, i.e., to move toward each other and connect upper edges of the unit patterns upon bending. In addition, it is possible to provide a display device capable of being bent or folded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A window panel, comprising:
a plurality of unit patterns arranged along a first direction, each of the plurality of unit patterns including:
a base surface portion,
a plurality of inclined portions, the plurality of inclined portions being inclined upwardly from the base surface portion,
a top portion disposed at a top of the inclined portions, and
a reinforcing member only partially covering the base surface portion,
wherein a lower edge of a first inclined portion of each unit pattern of the plurality of unit patterns adjoins a lower edge of a second inclined portion of a neighboring unit pattern, and
wherein the reinforcing member includes a plurality of discrete portions spaced apart from each other and positioned to overlap adjoined lower edges of neighboring unit patterns.

2. The window panel as claimed in claim 1, wherein the top portion includes a flat surface parallel to the base surface portion.

3. The window panel as claimed in claim 1, wherein the top portion includes a sharp peak.

4. The window panel as claimed in claim 1, further comprising a cover layer covering the unit patterns, the cover layer directly contacting the unit patterns.

5. The window panel as claimed in claim 1, wherein the inclined portions include at least first and second inclined surfaces facing each other, upper and lower edges of each of the first and second inclined surfaces extending in a second direction perpendicular to the first direction, and a lower edge of the second inclined surface of a unit pattern adjoins a lower edge of a first inclined surface of a neighboring unit pattern in the first direction.

6. The window panel as claimed in claim 5, wherein the adjoining lower edges of the first and second inclined surfaces of each pair of adjacent unit patterns in the first direction define first bending lines along the second direction, the first and second inclined surfaces on both sides of each of the first bending lines contacting each other when the window panel is bent along the first bending lines.

7. The window panel as claimed in claim 5, wherein the inclined portions further comprise third and fourth inclined surfaces facing each other and adjoining the first and second inclined surfaces at either side thereof, the unit patterns being arranged in a matrix pattern with a plurality of rows and columns.

8. The window panel as claimed in claim 7, wherein a lower edge of the third inclined surface of a unit pattern adjoins a lower edge of the fourth inclined surface of a neighboring unit pattern in the second direction.

9. The window panel as claimed in claim 8, wherein:
the adjoining lower edges of the first and second inclined surfaces of each pair of adjacent unit patterns in the first direction define first bending lines in the second direction, the adjoining lower edges of the third and fourth inclined surfaces of each pair of adjacent unit patterns in the second direction define second bending lines in the first direction, the first and second inclined surfaces on both sides of each of the first bending lines contact each other when the window panel is bent along the first bending lines, and the third and fourth inclined surfaces on both sides of each of the second bending lines contact each other when the window panel is bent along the second bending lines.

10. A display device, comprising:

a display panel; and a window panel on the display panel, the window panel including a plurality of unit patterns arranged along a first direction, and each of the plurality of unit patterns including:

a base surface, a plurality of inclined portions, the plurality of inclined portions being inclined upwardly from the base surface portion, and a top portion disposed at a top of the inclined portions, wherein a lower edge of a first inclined portion of each unit pattern of the plurality of unit patterns adjoins a lower edge of a second inclined portion of a neighboring unit pattern, wherein the plurality of unit patterns is arranged such that each of the unit patterns corresponds to at least one sub-pixel disposed therebelow, and wherein a width of one unit pattern ranges from a width of one sub-pixel to a width of one pixel.

11. The display device as claimed in claim 10, wherein the top portion includes a flat surface parallel to the base surface portion.

12. The display device of claim 10, wherein the top portion includes a sharp peak.

13. The display device as claimed in claim 10, further comprising a reinforcing member at a bottom of the window panel.

14. The display device as claimed in claim 10, further comprising a cover layer covering the unit patterns.

15. The display device as claimed in claim 10, wherein a first height, a first width, and a first angle defined as a distance between the base surface portion and the top portion, a distance between a pair of adjacent unit patterns, and an angle between the pair of adjacent unit patterns, respectively, satisfy the following equation:

$$w = \frac{2d}{\tan\left(\frac{180-\theta}{2}\right)}$$

where w, d, and θ denote the first width, the first height, and the first angle, respectively.

16. The display device as claimed in claim 15, wherein the first angle ranges from about 0.11 degrees to about 1.14 degrees.

17. The display device as claimed in claim 15, wherein:

the plurality of unit patterns is arranged such that each of the unit patterns corresponds to at least one sub-pixel disposed therebelow, and when the window panel is bent to define a bending radius, a number of sub-pixels within the bending radius and the first angle satisfy the following equation:

$$\theta = \frac{180}{N/3}$$

where N denotes the number of sub-pixels within the bending radius.

18. The display device as claimed in claim 17, wherein the first angle and a horizontal width of the sub pixels satisfy the following equation:

$$\theta = \frac{180}{\pi R} \times \frac{W}{3}$$

where R and W denote the bending radius and the horizontal width of the sub-pixels, respectively.

19. The display device as claimed in claim 10, wherein the inclined portions include at least first and second inclined surfaces facing each other, upper and lower edges of each of the first and second inclined surfaces extending in a second direction perpendicular to the first direction, and a lower edge of the second inclined surface of a unit pattern adjoins a lower edge of a first inclined surface of a neighboring unit pattern in the first direction.

20. The display device as claimed in claim 19, wherein the adjoining lower edges of the first and second inclined surfaces of each pair of adjacent unit patterns in the first direction define first bending lines along the second direction, the first and second inclined surfaces on both sides of each of the first bending lines contacting each other when the window panel is bent along the first bending lines.

21. The display device as claimed in claim 19, wherein the inclined portions further comprise third and fourth inclined surfaces facing each other and adjoining the first and second inclined surfaces at either side thereof, the unit patterns being arranged in a matrix pattern with a plurality of rows and columns.

22. The display device as claimed in claim 21, wherein a lower edge of the third inclined surface of a unit pattern adjoins a lower edge of the fourth inclined surface of a neighboring unit pattern in the second direction.

23. The display device as claimed in claim 22, wherein:

the adjoining lower edges of the first and second inclined surfaces of each pair of adjacent unit patterns in the first direction define first bending lines in the second direction, the adjoining lower edges of the third and fourth inclined surfaces of each pair of adjacent unit patterns in the second direction define second bending lines in the first direction, the first and second inclined surfaces on both sides of each of the first bending lines contact each other when the window panel is bent along the first bending lines, and the third and fourth inclined surfaces on both sides of each of the second bending lines contact each other when the window panel is bent along the second bending lines.

* * * * *